(12) United States Patent
Castillo Magcale

(10) Patent No.: US 11,690,203 B1
(45) Date of Patent: Jun. 27, 2023

(54) SYSTEMS AND METHODS FOR COOLING SERVER MODULES

(71) Applicant: Nautilus TRUE, LLC, Pleasanton, CA (US)

(72) Inventor: Arnold Castillo Magcale, San Ramon, CA (US)

(73) Assignee: Nautilus TRUE, LLC, San Ramon, CA (US)

( * ) Notice: Subject to any disclaimer, the term of this patent is extended or adjusted under 35 U.S.C. 154(b) by 71 days.

(21) Appl. No.: 17/494,827

(22) Filed: Oct. 5, 2021

(51) Int. Cl.
*H05K 7/20* (2006.01)

(52) U.S. Cl.
CPC ..... *H05K 7/20836* (2013.01); *H05K 7/20781* (2013.01)

(58) Field of Classification Search
CPC .................................................. H05K 7/20836
See application file for complete search history.

(56) References Cited

U.S. PATENT DOCUMENTS

| 8,590,333 | B2 * | 11/2013 | Carlson | F25D 16/00 62/99 |
| 11,457,547 | B1 * | 9/2022 | Gao | H05K 7/208 |

FOREIGN PATENT DOCUMENTS

| JP | WO 2019012714 A1 * | 1/2019 | .............. H01M 8/18 |

OTHER PUBLICATIONS

WO 2019012714 A1, English translation (Year: 2019).*

* cited by examiner

*Primary Examiner* — Mukundbhai G Patel
(74) *Attorney, Agent, or Firm* — Wilson Sonsini Goodrich & Rosati

(57) ABSTRACT

The present invention relates to a cooling system and method for regulating environmental conditions of a racked server unit having a plurality of server modules. The system comprises of an inlet line connected to a plurality of circulation conduits, wherein the plurality of circulation conduits receive a cooling medium from the inlet line, and the circulation conduits circulates the cooling medium through the racked server unit. A plurality of cold plates are positioned within the racked server unit, wherein one or more of the plurality of cold plates are thermally coupled to each of the plurality of server modules, and the plurality of cold plates are connected to one or more of the plurality of circulation conduits. An outlet line is connected to the plurality of circulation conduits, wherein the outlet line receives the cooling medium circulated through the racked server unit from the plurality of circulation conduits. A heat exchanger comprising a hot plate element, a cold plate element, and a thereto-osmotic membrane positioned between the hot plate element and the cold plate element, wherein the outlet line transfers the cooling medium circulated through the racked server unit to the hot plate element and the temperature of the cooling medium facing the hot plate element is regulated by transfer of heat from the cooling medium facing the hot plate element through the thereto-osmotic membrane to the hot plate element.

16 Claims, 3 Drawing Sheets

SYSTEMS AND METHODS FOR COOLING SERVER MODULES

TECHNICAL FIELD

The present invention generally relates to heat transfer and cooling systems and related methods. The present invention more particularly relates to systems for removing heat from liquid and/or air-cooled high density server racks or GPU electronics racks and methods of fabrication thereof. Still more particularly, the present invention relates to cooling apparatuses and cooled electronics racks, cooled by modular, stacked heat exchangers comprising complimentary open and closed loop liquid-flow compartments.

BACKGROUND OF THE INVENTION

A data center is a facility used to house various electronic and electrical devices such as computer systems, servers, and other associated components. Such electronic and electrical devices housed in the data center generate enormous amount of heat and therefore require environmental control and cooling systems to maintain environmental conditions suitable for optimal performance. These electronic and electrical devices along with the environmental control systems continuously consume significant amounts of energy. Modern data centers are required to optimize space utilization and therefore multiple computer server modules are stacked together in a rack to consolidate network resources and minimize floor space. With the large modern data centers requiring several megawatts (MW) of power to support and cool the computer systems and associated components therein, resource utilization efficiency has become critical to evaluating data center performance.

The enormous amount of energy used by the computer systems, servers, associated components, and more particularly high-density GPU rack based data centers, dissipate large amount of heat that can have an adverse effect on the performance of such devices and can even lead to fire incidents at the data center facility. Therefore, data center environmental control systems or cooling systems are used for maintaining the environmental/temperature conditions ideal for the performance of the computers and servers. These environmental control cooling systems regularly require a significant amount of water or other liquid coolants for its operation. Data center cooling system efficiency is critical to reduce the amount of water/or any other coolant used per kilowatt hour (kWh) of energy consumed by the computer systems and associated components housed in the data center.

Prior art methods and systems have attempted to develop multi metric views to provide a broader understanding of data center performance. These multi metric views often take into account a single aspect of data center performance, that is Power Usage Effectiveness (PUE), which is a measure of how efficiently a data center uses energy. However, there still remains a need for a more nuanced and multi-dimensional metric that addresses the critical aspects of data center performance, more particularly, scaled up, high density GPU rack based data centers. In order to establish a more complete view of data center performance, there exists a requirement to assess key aspects of data center performance such as data center efficiency, data center availability and data center sustainability. There remains an additional need for a multi-dimensional metric that is easily scalable and that can accommodate additional new metrics in the future, as they are defined. Embodiments disclosed address precisely such a need.

With exponential increases in power density, data center electronics produce more and more heat. GPU rack based data centers increase heat intensity exponentially. For effective operation of the computer system, the temperature of these devices has to be maintained within acceptable limits. Failure to remove heat effectively results in increased device temperatures, potentially leading to thermal runaway conditions. The need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, heat flux (Watts/cm$^2$) increases, resulting in the need to remove heat expeditiously from a given size chip or module. These trends have combined to create applications where it is no longer desirable to remove heat from modern devices solely by traditional air cooling methods, such as by using air cooled heat sinks with heat pipes or vapour chambers. Such air cooling techniques are inherently limited in their ability to extract heat from an electronic device with high power density.

The need to cool current and future high heat load, high heat flux electronic devices and systems therefore mandates the development of aggressive thermal management techniques using liquid cooling or/and hybrid cooling methods and systems. Embodiments disclosed address precisely such a need.

SUMMARY OF THE DISCLOSURE

In an embodiment, a cooling system is disclosed for regulating environmental conditions of a racked server unit. Such a racked server unit may enable stacking a plurality of server modules in a modular design. Each of these server modules may have one or more heat generating components. The cooling system may include an inlet line connected to a plurality of circulation conduits. In an aspect, the inlet line is connected to the plurality of circulation conduits by one or more inlet valves. The plurality of circulation conduits may be configured to receive a cooling medium from the inlet line and circulate the cooling medium through the racked server unit. For example, the cooling medium could be any coolant such as air, deionized water, coolant oil, ethylene glycol, propylene glycol, methanol, and a mixture thereof.

A plurality of cold plates are positioned within the racked server unit and may be thermally coupled to each of the plurality of server modules. In an aspect, the cold plates may be removably detachable from the racked server unit. These cold plates may be connected to one or more of the plurality of circulation conduits such that the cooling medium flowing through the circulation conduits gets thermally coupled with the cold plates for removing or reducing the heat produced by the server modules. The cold plates may be configured to transfer heat from the server modules to the cooling medium. The cold plate configuration may include fins, pins, fans, and other such features to assist in transferring the heat from the cold plate to the coolant.

An outlet line may be connected to the plurality of circulation conduits. The outlet line receives the cooling medium circulated through the racked server unit from the plurality of circulation conduits. In an aspect, the outlet line is connected to the plurality of circulation conduits by one or more outlet valves. In an aspect, the cooling medium is circulated through the racked server unit by means of a pump connected to the inlet line. Such an arrangement of the inlet line, circulation conduits, pump, the cold plates, and the outlet valve is designed to introduce the cooling medium from the inlet line to the circulation conduits, via the cold plates, and finally the cooling medium exits from the outlet line by means of the pump. Alternatively, some configurations of the cooling system may not include a pump, and instead, rely upon the expansion and contraction of the cooling medium as it absorbs and dissipates heat to propel the cooling medium to and from the cold plates.

Further, a heat exchanger is provided for transferring heat from the cooling medium being circulated in the racked server unit. The heat exchanger comprises a hot plate element, a cold plate element, and a thermo-osmotic membrane positioned between the hot plate element and the cold plate element. In an aspect, the thermo-osmotic membrane may be a porous carbon fiber membrane.

In another aspect, the cooling medium from the outlet line enters the heat exchanger and faces the hot plate element side of the heat exchanger. The outlet line transfers the cooling medium circulated through the racked server unit to the hot plate element and the temperature of the cooling medium facing the hot plate element is regulated by transfer of heat from the cooling medium facing the hot plate element through the thermo-osmotic membrane to the hot plate element. In an aspect, the thermo-osmotic membrane may be a porous carbon fiber membrane enabling reduction of temperature of the cooling medium facing the hot plate element.

The cooling medium after going through the heat exchanger is then again transferred by the inlet line to the racked server unit. This circulation of the cooling medium is done for either a predetermined number of loops or till the cooling medium reaches a predetermined temperature that may not be sufficiently reduced by the heat exchanger. At the end of the looped circulation the cooling medium could be transferred to a cooling mechanism outside the server room containing the racked server for cooling, and simultaneously a new batch of cooling medium could be introduced for circulation. In an aspect, such a heat exchanger may require actuation by means of a power unit supplying electrical energy.

In an aspect, a first automatic valve is provided that connects the inlet line to a cooling medium source. The first automatic valve opens for sending a predetermined quantity of cooling medium from the cooling medium source to the inlet line based on temperature of the cooling medium in circulation through the racked server unit, and closes thereafter. In another aspect, a second automatic valve is provided that connects the outlet line to a cooling medium collection tank. The second automatic valve opens for sending the cooling medium being circulated through the racked server unit from the outlet line to the cooling medium collection tank based on the temperature of the cooling medium in circulation through the racked server unit, and closes thereafter.

In an embodiment, a coolant distribution and collection manifold is disclosed. The coolant distribution and collection manifold may consist of the inlet line, the outlet line, the one or more inlet valves, the one or more outlet valves, the circulation conduits, a temperature detection unit for determining the temperature of the cooling medium being circulated through the racked server unit. In an aspect, the plurality of server modules are enabled to be connected and disconnected from the coolant distribution and collection manifold.

In another embodiment, the cooling medium source and the cooling medium collection tank may be connected with a cooling medium store. The cooling medium store receives cooling medium from the cooling medium collection tank, the cooling medium store regulates the temperature of the cooling medium, and then transfers the cooling medium at a predetermined temperature to the cooling medium source.

In another embodiment, a method for cooling a racked server unit having a plurality of server modules is disclosed. The method comprises the steps of, first fluidly connecting an inlet line to a plurality of circulation conduits, wherein a cooling medium is transferred from the inlet line to the circulation conduits for circulating the cooling medium through the racked server unit. Second, fluidly connecting a plurality of cold plates with the plurality of circulation conduits, wherein the cooling medium is transferred to the cold plates for thermal coupling of the cold plates with the plurality of server modules. Third step may comprise of fluidly connecting an outlet line with the plurality of circulation conduits, wherein the cooling medium is circulated through the racked server unit from the plurality of circulation conduits via the plurality of cold plates.

Thereafter, the cooling medium is circulated in a loop from the outlet line to a heat exchanger comprising a hot plate element, a cold plate element, and a thermo-osmotic membrane positioned between the hot plate element and the cold plate element. The cooling medium is transferred from the outlet line to the hot plate element and the temperature of the cooling medium facing the hot plate element is regulated by transfer of heat from the cooling medium facing the hot plate element through the thermo-osmotic membrane to the hot plate element, and then transferring the cooling medium from the hot plate element to the inlet line. In an aspect the thermo-osmotic membrane is a porous carbon fiber membrane or a sheet of porous carbon fiber membrane enabling the reduction of temperature of the circulating cooling medium.

The cooling medium circulating in the racked server unit is automatically removed and sent to a cooling medium collection tank by a second automatic valve connected to the outlet line. Simultaneously, a new stream or batch of cooling medium is automatically received from a cooling medium source by a first automatic valve and transferring the cooling medium from the cooling medium source to the inlet line. In an aspect, the cooling medium is automatically removed from circulation and automatically transferred from the cooling medium source based on the temperature of the cooling medium circulating in the racked server unit.

In an aspect, the cooling medium may be sent from the cooling medium collection tank to a cooling medium store for regulating the temperature of the cooling medium, and then the cooling medium is transferred at a predetermined temperature to the cooling medium source.

BRIEF DESCRIPTION OF THE DRAWINGS

The present invention can be better understood with reference to the following figures. In the figures, like reference numerals designate corresponding parts throughout the different views and/or embodiments. It will be understood that certain components and details may not appear in the figures to assist in more clearly describing the invention.

DETAILED DESCRIPTION

The following is a detailed description of embodiments of the invention depicted in the accompanying drawings. The embodiments are introduced in such detail as to clearly communicate the invention. However, the embodiment(s) presented herein are merely illustrative, and are not intended to limit the anticipated variations of such embodiments; on the contrary, the intention is to cover all modifications, equivalents, and alternatives falling within the spirit and scope of the appended claims. The detailed descriptions below are designed to make such embodiments obvious to those of ordinary skill in the art.

As stated above, the traditional way of monitoring data center infrastructure, collecting data from infrastructure systems, and managing the systems to allow maximizing the operational efficiency is now struggling to cope with new challenges brought by the growing complexity of data centers. Traditional cooling systems and methods are hopelessly inadequate in light of current scale and increased compute density. Embodiments disclosed include systems and methods that address these challenges effectively and efficiently.

Figure 1:
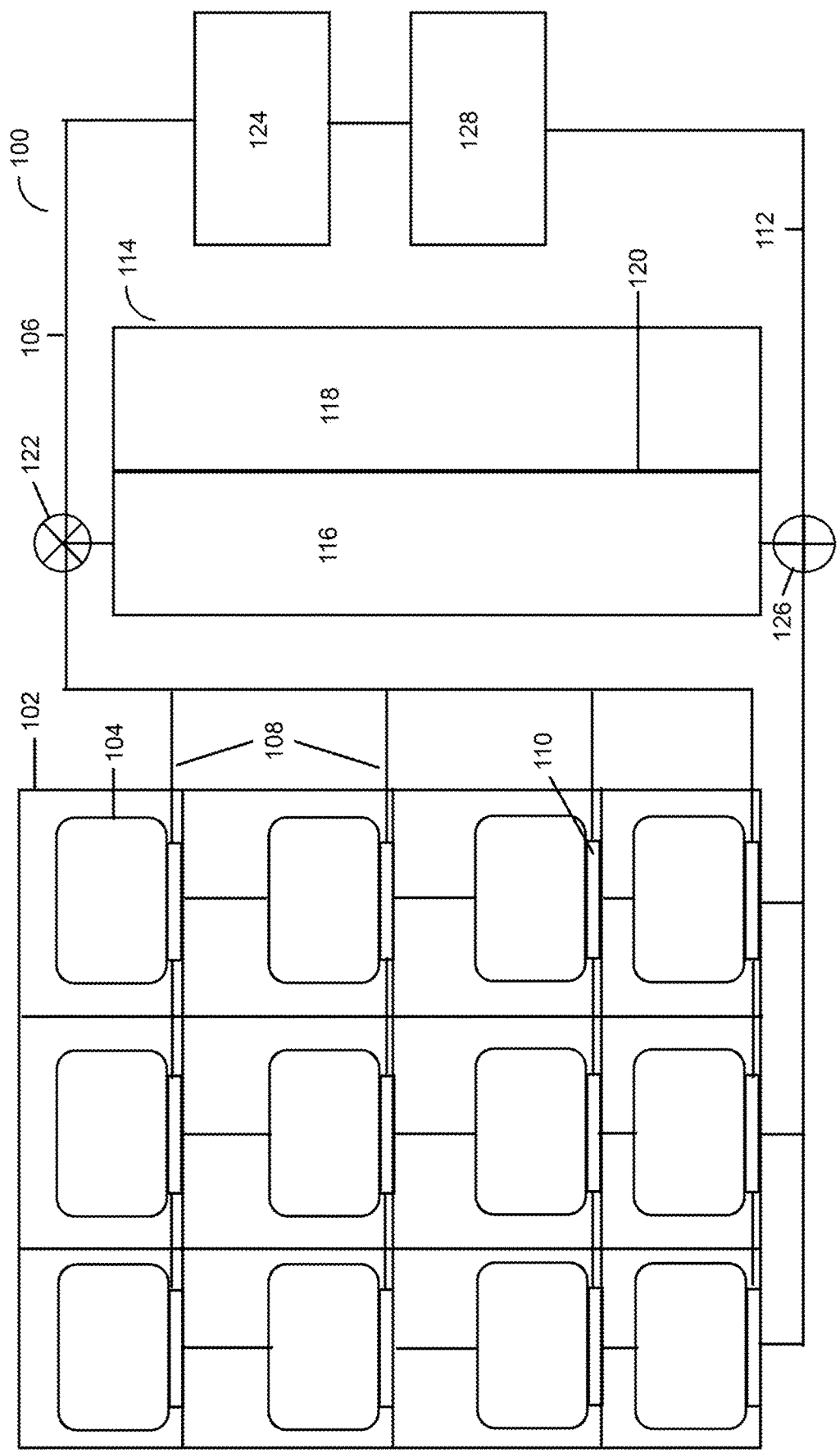
FIG. 1 is an illustration of an exemplary embodiment of a cooling system, according to an embodiment.

FIG. 1 illustrates a cooling system 100 for regulating the environmental conditions of a racked server unit 102. The racked server unit 102 may enable stacking/racking a plurality of server modules 104. Such server modules 104 may be configured within the racked server unit 102 according to a suitable modular design. The server modules 104 may individually be detachable from the racked server unit 102. Alternatively, the server modules 104 may be environmentally sealed within the racked server unit 102. Each of these server modules 104 may be a Graphics processing unit, a storage means, a central processing unit, an FPGA, or any other computing or storage modules as required. These server modules 104 may include one or more heat generating parts that generate heat during the operation of the server module. For a standard computer system, a fan such as a CPU fan is provided, however, for server modules 104 that are often under operations seamlessly without any break, a simple cooling fan or even conventional HVAC systems are not sufficient enough for optimal operation. Therefore, the present system utilizes specialized cooling mediums for cooling the server modules. In an aspect, the system as described herein may be used in duplicate for reliability or may even be used along with any other form of a cooling system such as an HVAC system which may be used along with the present system. The present system facilitates energy efficiency and a higher Power usage effectiveness (PUE). The cooling system 100 includes an inlet line 106 connected to a plurality of circulation conduits 108. The inlet line 106 carries a cooling medium from a cooling medium source 124 to the circulation conduits 108. In an aspect, the inlet line 106 is connected to the plurality of circulation conduits 108 by one or more inlet valves 202 (shown in FIG. 2). The inlet line 106 and the circulation conduits 108 may be made of the same material or different materials such as High-density polyethylene, copper, or any other suitable material. In an aspect, the cooling medium may be selected from a liquid medium such as deionized water, coolant oil, ethylene glycol, propylene glycol, methanol, and a mixture thereof. Alternatively, vapours or gases may also be used as cooling mediums.

The plurality of circulation conduits receive the cooling medium from the inlet line 106, and transfer the cooling medium to a plurality of cold plates 110. These cold plates 110 are positioned within the racked server unit 102 in thermal contact with the server modules. In an aspect, one or more of cold plates 110 are thermally coupled with the server modules.

An outlet line 112 is further connected to the plurality of circulation conduits 108 on the other end. The arrangement is such that the circulation conduits 108 at one end receive the cooling medium from the inlet line and at the other end transmit the cooling medium to the outline 112 via the cold plates. The outlet line 112 receives the cooling medium circulated through the racked server unit from the plurality of circulation conduits 108. In an aspect, the outlet line 112 may be connected to the plurality of circulation conduits 108 by one or more outlet valves 204 (shown in FIG. 2).

In an embodiment, a heat exchanger 114 is provided for reducing the temperature of the cooling medium being circulated. The heat exchanger 114 receives the cooling medium from the outlet line and cools down the cooling medium. The heat exchanger 114 may comprise of a hot plate element 116, a cold plate element 118, and a thermo-osmotic membrane 120. In an aspect, the thermo-osmotic membrane 120 is made up of carbon fiber. The thermo-osmotic membrane 120 is positioned between the hot plate element 116 and the cold plate element 118. The outlet line 112 transfers the cooling medium circulated through the racked server unit to the hot plate element 116 and the temperature of the cooling medium facing the hot plate element 116 is regulated by transfer of heat from the cooling medium facing the hot plate element 116 through the thermo-osmotic membrane 120 to the hot plate element 118. For example, the cooling medium entering the heat exchanger 114 may come in fluid contact with the hot plate element 116. In an aspect, the thermo-osmotic membrane may enable the transfer of heat from the hot plate element 116 to the cold plate element 118. In another aspect, the thermo-osmotic membrane 120 may enable transfer of cooling medium from the hot plate element 116 to the cold plate element 118 by means of thermo-osmosis.

In an aspect, a first automatic valve 122 is provided that connects the inlet line 106 to a cooling medium source 124. In another aspect, a second automatic valve 126 is provided that connects the outlet line 112 to a cooling medium collection tank 128. The first automatic valve 122 may include a first signaling module for receiving temperature related information from the racked server unit. The second automatic valve 126 may include a second signaling module that is communicatively coupled with the first signaling module. The first automatic valve 122 upon receiving the temperature related information from the racked server unit opens for sending a predetermined quantity of cooling medium from the cooling medium source 124 to the inlet line based on the temperature of the cooling medium in circulation through the racked server unit, and closes thereafter. The second signaling module upon receiving the temperature related information actuates the automatic valve to open for sending the cooling medium being circulated through the racked server unit from the outlet line 112 to the cooling medium collection tank 128 based on the temperature of the cooling medium in circulation through the racked server unit, and closes thereafter.

For example, the cooling medium may be circulated within the racked server and the heat exchanger unit 114 up to a certain temperature. The temperature of the cooling medium may be measured by means of a temperature detection unit. After the cooling medium reaches a certain temperature the loop of circulation through the heat exchanger is stopped and a new batch or stream of cooling medium is introduced from the cooling medium source 124. The cooling medium earlier being circulated is transferred out to the cooling medium collection tank 128. The cooling medium earlier being circulated may also be referred to as spent cooling medium. This spent cooling medium is then transferred to a cooling medium store 208 (shown in FIG. 2).

In another embodiment, a coolant distribution and collection manifold is provided. The coolant distribution and collection manifold may include the inlet line, the outlet line, the one or more inlet valves, the one or more outlet valves, the circulation conduits, a temperature detection unit for determining the temperature of the cooling medium being circulated through the racked server unit. In an aspect, the plurality of server modules 104 are enabled to be connected and disconnected from the coolant distribution and collection manifold.

In an embodiment, a complementary air-cooling module may also be provided for cooling a first set of server modules located at a relatively backward position in relation to a second set of server modules in a server room. The second set of server modules located in a frontal position may have access to relatively colder air in comparison to the first set of server modules positioned at the back which may be exposed to a hot environment due to hot air. The complementary air-cooling module may enable separating the hot air in the environment of the first set of server modules from the colder air in the environment of the second set of server modules.

Figure 2:
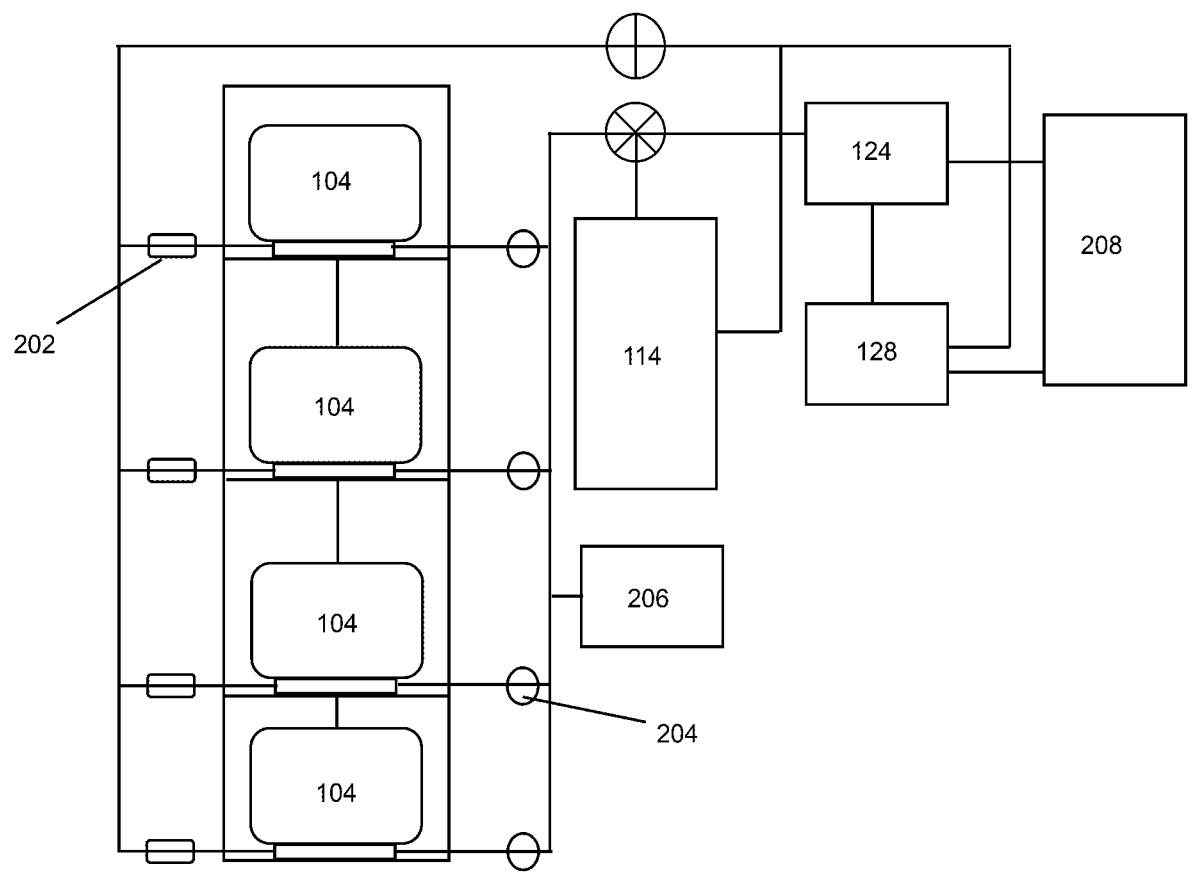
FIG. 2 illustrates an exemplary implementation of the system of the FIG. 1, in accordance with an exemplary embodiment.

FIG. 2 illustrates an exemplary implementation of the system of FIG. 1, in accordance with an exemplary embodiment. In an aspect, the racked server, the coolant distribution and collection manifold, the pump 206, and the heat exchanger 114 may be located inside a specific room such as a server room. The remaining units and modules of the cooling system may be positioned at another location. The location of the various modules may be decided while finalizing the data center layout.

The inlet line 106 may be connected to the plurality of circulation conduits by one or more inlet valves. And the outlet line 112 may be connected to the plurality of circulation conduits by one or more outlet valves. The cooling medium is circulated through the racked server unit by the pump 206 connected to the inlet line. In an alternate aspect the pump 206 may be connected to the cooling system in a way to enable the circulation of the cooling medium within the racked server unit as well as for transferring the cooling medium to the heat exchanger, cooling medium source 124, cooling medium collection tank 128, and the cooling medium store 208.

The cooling medium store 208 may be a facility for cooling the cooling medium and to store the cooling medium. The cooling medium store 208 may be provided with the necessary devices for reducing the temperature of the cooling medium to an optimal temperature as required.

Figure 3:
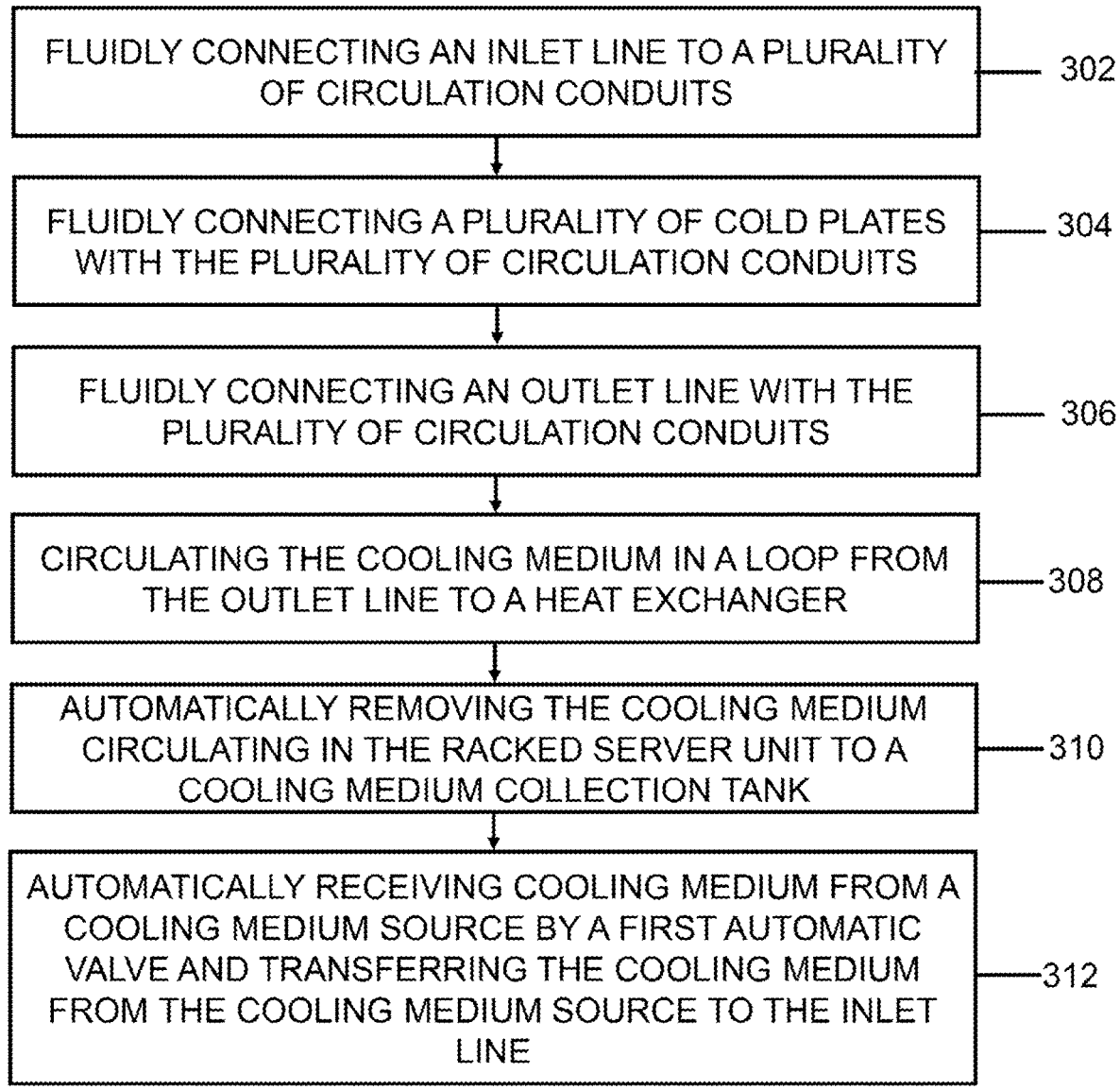
FIG. 3 is a flowchart illustrating a method for cooling one or more server modules by means of a server cooling system, according to an embodiment.

FIG. 3 illustrates a method for cooling one or more server modules by means of a server cooling system, according to an exemplary embodiment. At step 302, an inlet line 106 is fluidly connected to a plurality of circulation conduits 108. The cooling medium is transferred from the inlet line 106 to the circulation conduits for circulating the cooling medium through the racked server unit. At step 304, a plurality of cold plates 110 are fluidly connected with the plurality of circulation conduits 108, wherein the cooling medium is transferred to the cold plates for thermal coupling of the cold plates with the plurality of server modules. At step 306, an outlet line is fluidly connected with the plurality of circulation conduits 108, wherein the cooling medium is circulated through the racked server unit from the plurality of circulation conduits 108 via the plurality of cold plates.

At step 306, the cooling medium is circulated in a loop from the outlet line to a heat exchanger comprising a hot plate element 116, a cold plate element 118, and a thermo-osmotic membrane 120 positioned between the hot plate element 116 and the cold plate element 118. The cooling medium is transferred from the outlet line to the hot plate element 116 and the temperature of the cooling medium facing the hot plate element 116 is regulated by transfer of heat from the cooling medium facing the hot plate element 116 through the thermo-osmotic membrane 120 to the hot plate element 118. Then the cooling medium is transferred from the hot plate element 116 to the inlet line At step 308, the temperature of the cooling medium is determined. In an alternate aspect, the temperature of the cooling medium may be continuously determined by necessary module provided in the cooling system. In case a predetermined temperature level of the cooling medium is reached then the stream of cooling medium in circulation is automatically removed and sent to a cooling medium collection tank by the second automatic valve 124 connected to the outlet line 112, step 310.

Simultaneously at step 312, a fresh stream of cooling medium is received from the cooling medium source 124 by first automatic valve 122 and the cooling medium is transferred from the cooling medium source to the inlet line for circulation. In an aspect, the cooling medium from the cooling medium collection tank is sent to a cooling medium store for regulating the temperature of the cooling medium, and then transfers the cooling medium at a predetermined temperature to the cooling medium source 124.

According to an embodiment of the cooling system, the individual server rack modules may be connected and disconnected from the coolant distribution and collection manifold via a first plurality and a second plurality of connectors, while the remaining server modules continue to be cooled by the circulation of the first cooling medium.

According to an embodiment of the cooling system, the cooling system is one of a plurality of duplicate cooling systems, wherein each cooling system cools a separate rack housing a plurality of server modules and the plurality of cooling systems all circulate the cooling medium to the cooling device where heat is removed. Preferably, the pair of fluid connectors are self-sealing connectors, and the cooling device is configured to reuse at least a portion of the heat from the second cooling medium.

According to an embodiment of the cooling system, the heat exchanger is mounted on the server rack housing the plurality of server modules.

Since various possible embodiments might be made of the above invention, and since various changes might be made in the embodiments above set forth, it is to be understood that all matter herein described or shown in the accompanying drawings is to be interpreted as illustrative and not to be considered in a limiting sense. Thus, it will be understood by those skilled in the art of systems and methods that facilitate cooling of electronic systems, and more specifically automated cooling infrastructure especially pertaining to data centers, that although the preferred and alternate embodiments have been shown and described in accordance with the Patent Statutes, the invention is not limited thereto or thereby.

The figures illustrate the architecture, functionality, and operation of possible implementations of systems, methods and computer program products according to various embodiments of the present invention. It should also be noted that, in some alternative implementations, the functions noted/illustrated may occur out of the order noted in the figures. For example, two blocks shown in succession may, in fact, be executed concurrently, or the blocks may sometimes be executed in the reverse order, depending upon the functionality involved.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The present invention and some of its advantages have been described in detail for some embodiments. It should be understood that although the system and process is described with reference to liquid-cooled conduction cooling structures and air cooled structures in data centers, the system and method is highly reconfigurable, and may be used in other industrial, commercial, and residential refrigeration, cooling, heating and HVAC systems. Portions of the embodiment may be used to support other types of heating, cooling, ventilation, and refrigeration systems in industrial, commercial, residential, transportation, and other systems. Modifications of the embodiments may be used in heat transfer systems, and to capture emitted heat from heat sources and convert the captured heat to electricity to serve as an auxiliary power source. It should also be understood that various changes, substitutions and alterations can be made herein without departing from the spirit and scope of the invention as defined by the appended claims. An embodiment of the invention may achieve multiple objectives, but not every embodiment falling within the scope of the attached claims will achieve every objective. Moreover, the scope of the present application is not intended to be limited to the particular embodiments of the process, machine, manufacture, composition of matter, means, methods and steps described in the specification. A person having ordinary skill in the art will readily appreciate from the disclosure of the present invention that processes, machines, manufacture, compositions of matter, means, methods, or steps, presently existing or later to be developed are equivalent to, and fall within the scope of, what is claimed. Accordingly, the appended claims are intended to include within their scope such processes, machines, manufacture, compositions of matter, means, methods, or steps.

What is claimed is:

1. A cooling system for regulating environmental conditions of a racked server unit having a plurality of server modules, the system comprising:
    an inlet line connected to a plurality of circulation conduits, wherein the plurality of circulation conduits receive a cooling medium from the inlet line, and the circulation conduits circulates the cooling medium through the racked server unit;
    a plurality of cold plates positioned within the racked server unit, wherein one or more of the plurality of cold plates are thermally coupled to each of the plurality of server modules, and the plurality of cold plates are connected to one or more of the plurality of circulation conduits;
    an outlet line connected to the plurality of circulation conduits, wherein the outlet line receives the cooling medium circulated through the racked server unit from the plurality of circulation conduits;
    a heat exchanger comprising a hot plate element, a cold plate element, and a thermo-osmotic membrane positioned between the hot plate element and the cold plate element, wherein the outlet line transfers the cooling medium circulated through the racked server unit to the hot plate element and the temperature of the cooling medium facing the hot plate element is regulated by transfer of heat from the cooling medium facing the hot plate element through the thermo-osmotic membrane to the hot plate element;
    a first automatic valve connecting the inlet line to a cooling medium source; and
    a second automatic valve connecting the outlet line to a cooling medium collection tank;
        wherein the first automatic valve opens for sending a predetermined quantity of cooling medium from the cooling medium source to the inlet line based on temperature of the cooling medium in circulation through the racked server unit, and closes thereafter; and
        wherein the second automatic valve opens for sending the cooling medium being circulated through the racked server unit from the outlet line to the cooling medium collection tank based on the temperature of the cooling medium in circulation through the racked server unit, and closes thereafter.

2. The cooling system of claim 1, wherein the inlet line is connected to the plurality of circulation conduits by one or more inlet valve.

3. The cooling system of claim 1, wherein the outlet line is connected to the plurality of circulation conduits by one or more outlet valve.

4. The cooling system of claim 1, wherein the cooling medium is circulated through the racked server unit by a pump connected to the inlet line.

5. The cooling system of claim 1, wherein the cooling medium flows through the plurality of cold plates to regulate temperature of the server modules.

6. The cooling system of claim 1, wherein the cooling medium is selected from a group consisting of deionized water, coolant oil, ethylene glycol, propylene glycol, methanol, and a mixture thereof.

7. The cooling system of claim 1, comprising a coolant distribution and collection manifold, wherein the coolant distribution and collection manifold consists of the inlet line, the outlet line, the one or more inlet valve, the one or more outlet valve, the circulation conduits, a temperature detection unit for determining the temperature of the cooling medium being circulated through the racked server unit.

8. The cooling system of claim 7, wherein the plurality of server modules are enabled to be connected and disconnected from the coolant distribution and collection manifold.

9. The cooling system of claim 1, wherein plurality of racked server units are connected with the cooling system.

10. The cooling system of claim 1, wherein the heat exchanger is mounted on the racked server unit.

11. The cooling system of claim 1, wherein the heat exchanger is actuated by means of a power unit supplying electricity.

12. The cooling system of claim 1, wherein the cooling medium source and the cooling medium collection tank are connected with a cooling medium store, wherein the cooling medium store receives cooling medium from the cooling medium collection tank, the cooling medium store regulates the temperature of the cooling medium, and then transfers the cooling medium at a predetermined temperature to the cooling medium source.

13. The cooling system of claim 1, wherein the thereto-osmotic membrane is made of carbon fiber.

14. A method for cooling a racked server unit having a plurality of server modules, comprising:
fluidly connecting an inlet line to a plurality of circulation conduits, wherein a cooling medium is transferred from the inlet line to the circulation conduits for circulating the cooling medium through the racked server unit;
fluidly connecting a plurality of cold plates with the plurality of circulation conduits, wherein the cooling medium is transferred to the cold plates for thermal coupling of the cold plates with the plurality of server modules;
fluidly connecting an outlet line with the plurality of circulation conduits, wherein the cooling medium is circulated through the racked server unit from the plurality of circulation conduits via the plurality of cold plates;
circulating the cooling medium in a loop from the outlet line to a heat exchanger comprising a hot plate element, a cold plate element, and a thermo-osmotic membrane positioned between the hot plate element and the cold plate element, wherein the cooling medium is transferred from the outlet line to the hot plate element and the temperature of the cooling medium facing the hot plate element is regulated by transfer of heat from the cooling medium facing the hot plate element through the thereto-osmotic membrane to the hot plate element, and then transferring the cooling medium from the hot plate element to the inlet line;
automatically removing the cooling medium circulating in the racked server unit to a cooling medium collection tank by a second automatic valve connected to the outlet line; and
automatically receiving cooling medium from a cooling medium source by a first automatic valve and transferring the cooling medium from the cooling medium source to the inlet line;
wherein the cooling medium is automatically removed from circulation and automatically transferred from the cooling medium source based on the temperature of the cooling medium circulating in the racked server unit.

15. The method as claimed in claim 14, wherein the cooling medium from the cooling medium collection tank is sent to a cooling medium store for regulating the temperature of the cooling medium, and then transfers the cooling medium at a predetermined temperature to the cooling medium source.

16. A method for cooling a racked server unit having a plurality of server modules, comprising:
circulating a cooling medium through the racked server unit by transferring the cooling medium from an inlet line to a plurality of circulation conduits fluidly connected to the inlet line;
transferring the cooling medium to a plurality of cold plates fluidly connected to the plurality of circulation conduits wherein the cooling medium is transferred to the cold plates for thermal coupling of the cold plates with the plurality of server modules;
circulating the cooling medium through the racked server unit from the plurality of circulation conduits fluidly connected to an outlet line via the plurality of cold plates;
circulating the cooling medium in a loop from the outlet line to a heat exchanger comprising a hot plate element, a cold plate element, and a thereto-osmotic membrane positioned between the hot plate element and the cold plate element, wherein the cooling medium is transferred from the outlet line to the hot plate element;
regulating the temperature of the cooling medium facing the hot plate element by transferring heat from the cooling medium facing the hot plate element through the thereto-osmotic membrane to the hot plate element, and then transferring the cooling medium from the hot plate element to the inlet line;
automatically removing the cooling medium circulating in the racked server unit to a cooling medium collection tank by a second automatic valve connected to the outlet line; and
automatically receiving cooling medium from a cooling medium source by a first automatic valve and transferring the cooling medium from the cooling medium source to the inlet line;
wherein the cooling medium is automatically removed from circulation and automatically transferred from the cooling medium source based on the temperature of the cooling medium circulating in the racked server unit.

\* \* \* \* \*